United States Patent
Avivi et al.

(10) Patent No.: US 10,164,584 B2
(45) Date of Patent: Dec. 25, 2018

(54) METHOD TO MITIGATE UNDESIRED OSCILLATOR FREQUENCY MODULATION EFFECTS IN-SIDE A SYNTHESIZER DUE TO INTERFERENCE SIGNALS AND SYNTHESIZER CIRCUIT

(71) Applicant: Intel IP Corporation, Santa Clara, CA (US)

(72) Inventors: Rotem Avivi, Petah-Tiqwa (IL); Giuseppe Li Puma, Bochum (DE)

(73) Assignee: Intel IP Corporation, Santa Clara, CA (US)

(*) Notice: Subject to any disclaimer, the term of this patent is extended or adjusted under 35 U.S.C. 154(b) by 0 days.

(21) Appl. No.: 15/609,042

(22) Filed: May 31, 2017

(65) Prior Publication Data
US 2018/0006616 A1   Jan. 4, 2018

(30) Foreign Application Priority Data
Jul. 1, 2016   (EP) ..................................... 16177578

(51) Int. Cl.
| | | |
|---|---|---|
| *H03D 3/18* | (2006.01) |
| *H03D 3/24* | (2006.01) |
| *H03F 1/32* | (2006.01) |
| *H04L 27/227* | (2006.01) |
| *H04B 1/16* | (2006.01) |
| *H04B 1/04* | (2006.01) |
| *H03L 7/099* | (2006.01) |
| *H03L 7/093* | (2006.01) |
| *H03F 3/19* | (2006.01) |
| *H03F 3/24* | (2006.01) |
| *H03L 7/197* | (2006.01) |

(52) U.S. Cl.
CPC ............. *H03F 1/3252* (2013.01); *H03F 3/19* (2013.01); *H03F 3/245* (2013.01); *H03L 7/093* (2013.01); *H03L 7/099* (2013.01); *H03L 7/0992* (2013.01); *H04B 1/04* (2013.01); *H04B 1/16* (2013.01); *H04L 27/227* (2013.01); *H03L 7/1976* (2013.01)

(58) Field of Classification Search
CPC .......... H03F 1/3252; H03F 3/19; H03F 3/245; H04L 27/227; H04B 1/16; H04B 1/04; H03L 7/0992; H03L 7/093; H03K 5/00006
USPC ................................ 375/296, 267, 326, 327
See application file for complete search history.

(56) References Cited

U.S. PATENT DOCUMENTS 9,059,721 B2    6/2015  Muhammad
9,257,999 B1*   2/2016  Vilhonen ................ H03L 7/093
(Continued)

OTHER PUBLICATIONS

Ahmad Mirzaei, Pulling Mitigation in Wireless Transmitters, IEEE Journal of solid-state circuits, vol. 49, No. 9, Sep. 2014, 1958-1970.

*Primary Examiner* — Phuong Phu
(74) *Attorney, Agent, or Firm* — 2SPL Patentanwaelte PartG mbB; Mani Arabi

(57) ABSTRACT

A synthesizer circuit to generate a local oscillator carrier signal for a baseband signal includes a controlled oscillator comprising a phase lock loop and an oscillator configured to generate an oscillating signal. A pulling compensation circuit is configured to generate a correction signal for a present output of the phase locked loop using information on an error of the oscillating signal, information on a present sample of a baseband signal and a preceding correction signal for a preceding output of the phase locked loop.

24 Claims, 9 Drawing Sheets

(56) References Cited

U.S. PATENT DOCUMENTS

2007/0237260 A1\* 10/2007 Hori ................. H03F 1/3247
                                              375/296
2009/0268791 A1  10/2009 Waheed et al.
2014/0191815 A1   7/2014 Mirzaei et al.
2016/0028411 A1   1/2016 Kuo et al.
2016/0164464 A1\*  6/2016 Sun .................. H03K 5/00006
                                              327/115

\* cited by examiner

METHOD TO MITIGATE UNDESIRED OSCILLATOR FREQUENCY MODULATION EFFECTS IN-SIDE A SYNTHESIZER DUE TO INTERFERENCE SIGNALS AND SYNTHESIZER CIRCUIT

FIELD

Examples relate to Methods to mitigate a leakage effect inside the Synthesizer, the leakage effect being related to interference signal, e.g. caused by the uplink transmit signal or baseband interference signals or another known modulated or unmodulated signal.

BACKGROUND

In transmitters based on a direct conversion transmission technology, a possible topology is to use a harmonic Voltage Controlled Oscillator (VCO) in which the VCO frequency is twice or 4 times the center frequency of the transmitted signal at the power amplifier (PA) output. This topology helps to prevent Spurs and allows for an efficient implementation. However, one disadvantage of such a topology is that the harmonics of the transmitted signal fall on the VCO frequency (e.g. the 2nd harmonic if the VCO is at twice the transmitted frequency or the 4th harmonic if it is at four times the transmitted frequency) and might alter ("pull") its frequency and thus degrade the local oscillator (LO) phase noise (PN). This effect is called pulling injection. Although the power amplifier of the transmit chain using the VCO is one source of pulling injection. Further, all types of oscillators may be affected, for example also digitally controlled oscillators (DCO's or NCO's). All types of oscillators using a phase control loop to stabilize an oscillator output are subsequently named controlled oscillators. In next generation implementations, pulling injection is likely to be increased if the die size is going to be shrunk, bringing the PA closer to the VCO. It is desirable to mitigate the effects of pulling and, for example, to decrease the phase noise of a controlled oscillator.

BRIEF DESCRIPTION OF THE FIGURES

Some embodiments of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent", to name just a few examples).

The terminology used herein is for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

Figure 1:
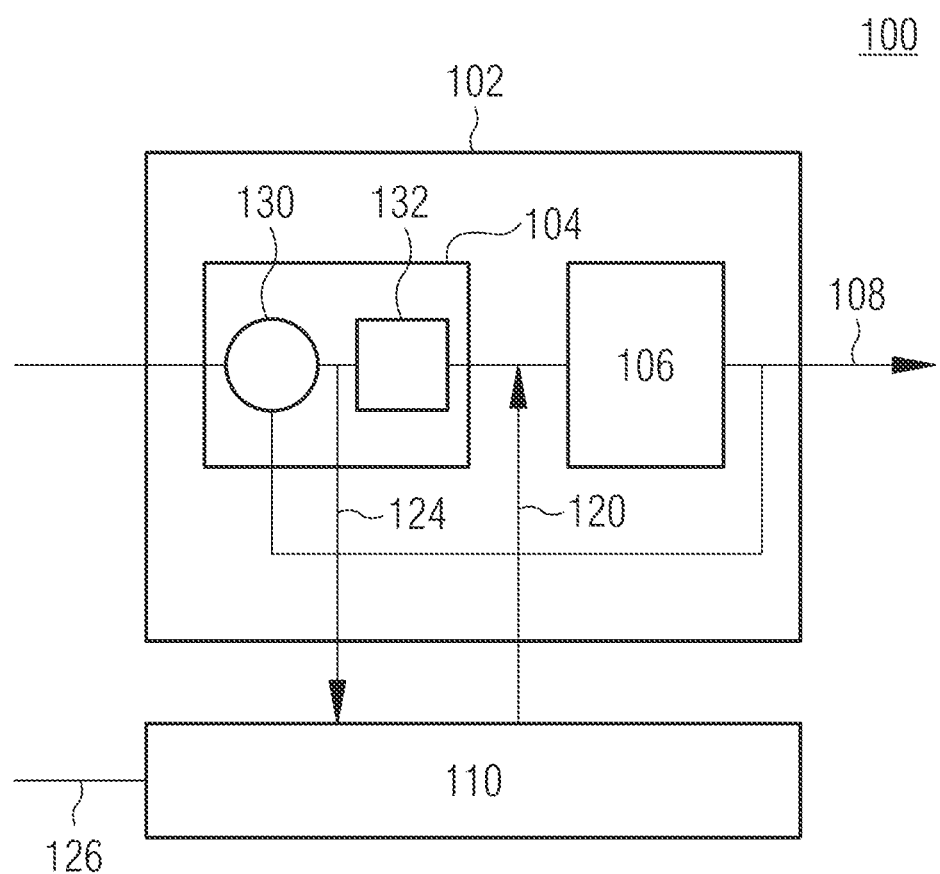
FIG. 1 illustrates an example of a synthesizer circuit.

FIG. 1 illustrates an example of a synthesizer circuit 100 to generate a local oscillator carrier signal for a baseband signal. The local oscillator carrier signal may be directly used to upmix the baseband signal or to derive a further mixing signal which is then used to upmix the baseband signal. A controlled oscillator 102 comprises a phase lock loop 104 and an oscillator 106 configured to generate an oscillating signal 108. A pulling compensation circuit 110 is configured to generate a correction signal 120 for a present output of the phase locked loop 104 using information on an error of the oscillating signal 124, information on the leaked baseband signal 126 and on a preceding correction signal for a preceding output of the phase locked loop 104. Within the phase lock loop 104, a phase detector 130 serves to determine the present phase error of the oscillating signal 108 by comparing it with a steering signal used to set the desired phase or operating frequency of the oscillator 106. A filter 132 is used to adjust a control signal for the oscillator 106 in order to consider the presently detected error. According to some examples, the correction signal 120 depends on the present sample of the baseband signal 126.

It is important to note that the correction signal 120 does not only depend on the error signal but also on information on the baseband signal 126. Information on the baseband signal is transferred from the transmit (Tx) lineup/modem into the phase locked loop 104 (the PLL sub-system, which may, for example, be a digital phase locked loop or DPLL) and used to create the correction signal 120 (the "inverse pulling") which is injected into the phase locked loop 104 in order to mitigate or even cancel the pulling impairment. In also using the baseband signal to be transmitted using the oscillating signal 108 generated by the controlled oscillator 102, pulling impairments can be reduced while an associated transmit signal chain is in normal operation mode. This may save on time and cost for dedicated calibration modes or algorithms during which no normal transmission would be possible. Suppression of pulling effects can also lead to better results if it is continuously performed since it automatically considers eventual changes of the operating conditions.

Figure 2:
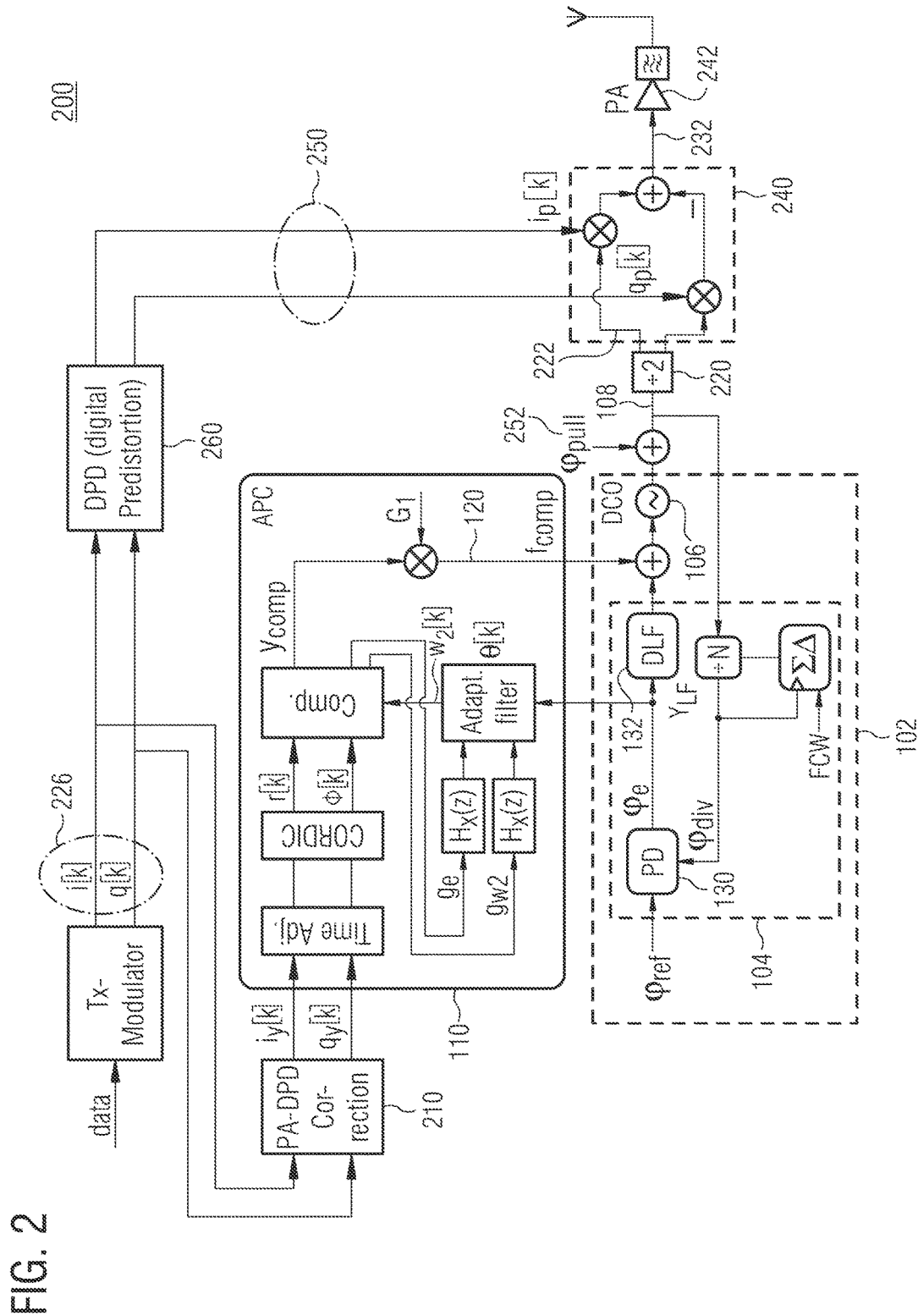
FIG. 2 illustrates an example of a transmitter for baseband signal using an example of a synthesizer circuit having a predistortion circuit.

In some examples, the correction signal ("inverse pulling") should be injected with an optimum Phase and Gain. Subsequently, one particular example is given as to how to find Phase and Gain components of the correction signal 120 such that the error within the oscillating signal 108 generated by the controlled oscillator (e.g. the deviation of the frequency or phase of the generated oscillating signal from a desired oscillating signal) can be decreased or minimized considering the impairments of oscillator pulling. In the following considerations, some emphasis is given to pulling caused by a power amplifier generating harmonics at the frequency of the desired oscillating signal. Nonetheless, the resultant algorithm and correction signal generation can mitigate pulling impairments irrespective of their root cause. For the further considerations, additional reference is also made to FIG. 2, illustrating more components of a transmit signal chain for transmitting a baseband signal using I/Q Modulation. FIG. 2 shows a Cartesian or IQ modulator including the pulling compensation circuit 110, which also receives the IQ-data as an input to the compensation circuit 110. The pulling compensation signal 110 generates the correction signal that is injected or superimposed to the signal at the output of the filter 132 of the phase lock loop 104. The subsequent paragraphs will focus on an iterative approximation approach in which the two parameters gain component and phase component of the correction signal 120 are determined in order to correct the pulling.

Further to the components of the synthesizer circuit 100 of FIG. 1, transmitter circuit 200 comprises a mixer circuit 240 configured to mix a signal which depends on a baseband signal 250 and a carrier signal 222 to generate a radio frequency signal 232. The carrier signal 222 used by mixer circuit 240 is generated by a frequency divider 220 configured to divide the frequency of the oscillating signal 108 by a division factor n, n equaling 2 in the example of FIG. 2.

FIG. 2 illustrates Cartesian I/Q modulation to generate the radio frequency signal 232 from the baseband signal 250, which is given by its In-Phase (I) and Quadrature (Q) components. However, the following considerations do equally apply to other transmit chain implementations, such as for example to Polar Modulators and Digital Direct Synthesis Modulators. Further, the considerations equally apply to classical mixer implementations and to other mixer circuits, such as for example to implementations using Radio Frequency Digital to Analog Converters which perform the mixing to channel frequencies together with Digital to Analog conversion. The transmitter circuit further comprises an amplifier 242 to amplify the radio frequency signal 232. The transmitter further comprises a Power Amplifier Predistortion circuit 260 (PAPD) to estimate nonlinearities of the Amplifier 242 (PA) for the frequency of the radio frequency signal 232, that is for the fundamental frequency of the radio frequency signal. In the implementation of FIG. 2, PLL 104 comprises a Phase detector (PD) 130 and a filter (DLF) 132. The phase detector 130 is used to determine the error signal $\varphi_e$, i.e. the deviation of the signal presently output by the oscillator 106 from a reference phase $\varphi_{ref}$ used to steer the PLL 102. Based on the presently determined error signal, filter 132 determines a control signal $Y_{1F}$ for the oscillator 106 to alter its present phase and/or frequency to consider the error signal. The correction signal 120 is superimposed or added to the said control signal $Y_{1F}$.

A transmit signal (e.g. sample 'n') at the input of PAPD 260 has the form (given in polar representation):

$$A_{papd}(n) \cdot \exp^{j\alpha_{papd}(n)}.$$

With $w_c$ being the center frequency of the channel, the first harmonic at the output of PA 242 has the form:

$$\mathrm{re}\{g_1 \cdot A_{papd}(n) \cdot \exp^{j(w_c \cdot t + \alpha_{papd}(n) + \varphi 1)}\}.$$

The second harmonic the output of PA 242 has the form:

$$\mathrm{re}\{g_1^2 \cdot A_{papd}^2(n) \cdot \exp^{j(2w_c \cdot t + 2\alpha_{papd}(n) + 2\varphi 1)}\}.$$

The k-th harmonic has the following form:

$$\mathrm{re}\{g_1^k \cdot A_{papd}^k(n) \cdot \exp^{j(kw_c \cdot t + k\alpha_{papd}(n) + k\varphi 1)}\}.$$

In the following, the considerations will be in general terms, i.e. for a division factor of k and, therefore, for the k-th harmonic.

Where g1 and φ1 are unknown gain and phase alterations between PAPD 260 and PA 242, assuming that PA 242 and PAPD 260 are back-to-back linear.

Assuming a pulling impairment caused by the PA 242, a channel between PA 242 and controlled oscillator 102 may be characterized in adding additional gain and phase g2 and φ2 to the output of the PA 242 assuming that it is a single tap channel without memory effects. It is assumed that the second harmonic is one source of pulling. Pulling changes the signal at the output of the oscillator 252 by injecting a pulling signal or term.

The pulling is proportional to the Amplitude and to the Phase difference between the controlled oscillator 102 and the injection signal such that we get the following pulling term 252:

$$d(n) = g_2 \cdot g_1^k A_{papd}^k(n) \cdot \sin(k \cdot \alpha_{papd}(n) + k\varphi_1 + \varphi_2).$$

To be able to cancel this undesired caused by the harmonic of the order k=2, the correction signal 120 to be injected or superimposed can have the general form:

$$g \cdot A_{papd}^k(n) \cdot \sin(k \cdot \alpha_{papd}(n) + \varphi),$$

where g and φ are unknown gain and phase components of the correction signal 120, for example, be found using calibration/LMS as described subsequently.

While the previous considerations assume that the pulling has been caused by the second harmonic, further examples can consider arbitrary harmonics as a source of the pulling impairment. For a harmonic of the order k, the correction signal 120 reads:

$$g \cdot A_{papd}^{k}(n) \cdot \sin(k \cdot \alpha_{papd}(n) + \varphi).$$

Both pulling term 252 and correction signal 120 are injected into the PLL 102, as indicated in FIG. 2. The pulling term 252 is assumed to be superimposed after the output of the oscillator 106. In order to be able to alter the generation of oscillating signal 108, the correction signal 120 is injected or superimposed before the oscillator 106.

Both pulling term 252 and correction signal 120 (correction term) go through different, unknown transfer functions such that the additional net error term ($e^2(n)$) (caused by both pulling and the correction signal) is:

$$e^2(n) = (g \cdot A_{papd}^{k}(n) \cdot \sin(k \cdot \alpha_{papd}(n) + \varphi) * TF1(n) - d(n) * TF2(n))^2.$$

In the above error term, d(n) is the correction signal 120, TF1 is the transfer function from the output of filter 132 of the phase lock loop 104 to the output of phase detector 130 of the phase lock loop 104. TF2 is the transfer function from the output of oscillator 106 to the output of Phase detector 130 of the phase lock loop 104.

If $e^2(n)$ is minimized, the pulling impairment can be decreased to a great extent. For example, g and $\varphi$ minimizing $e^2(n)$ can be found using LMS techniques.

In the following, one example is given to determine g and $\varphi$ of a correction signal 120 such that a degradation of the phase noise of the oscillating signal 108, which is caused by pulling terms, e.g. due to an amplifier 240 using the oscillating signal 108, is reduced or minimized.

According to one example, the coefficients g and $\varphi$ are found based on a modification of a Least Mean Square (LMS) approximation. In particular, two parallel LMS algorithms are performed for each, the gain and the phase components of the correction signal 120. In other words, a first approximation rule is used for the gain component and a second approximation rule is used for the phase component.

The gradient of $e^2(n)$ is derived for each parameter. For the first approximation rule for the gain parameter, one receives:

$$g_{gradient}(n) = \frac{\partial e^2(n)}{\partial g} = 2 \cdot e(n) \cdot A_{papd}^{k}(n) \cdot \sin(k \cdot \alpha_{papd}(n) + \varphi_{est}(n-1)) * TF1(n).$$

The LMS algorithm is an iterative approach, determining an estimate for a present sample of the gain component $g_{est}(n)$ based on the estimate of the preceding iteration $g_{est}(n-1)$ and on the present gradient $g_{gradient}(n)$. The basic ides of an LMS approximation is, that if the gradient of the present PLL square error $e^2(n)$ is positive, it implies that error e(n) would keep increasing positively, if the previous estimate $g_{est}(n-1)$ is used for further iterations, which means one needs to reduce the present estimate $g_{est}(n)$. Same considerations apply for the present estimate of the phase component $\varphi_{est}(n)$.

According to the example given, unknown phase $\varphi$ within $g_{gradient}(n)$ is substituted by the phase estimation $\varphi_{est}(n-1)$ of the last iteration of the algorithm. The estimation of the gain parameter $g_{est}(n)$ for the present iteration is then determined according to:

$$g_{est}(n) = g_{est}(n-1) - \mu_{gain} \cdot g_{gradient}(n).$$

Similarly, the second approximation rule for phase component uses the gradient of $e^2(n)$ for the Phase component $\varphi$:

$$g_{gradient}(n) = \frac{\partial e^2(n)}{\partial \varphi} = 2 \cdot e(n) \cdot g_{est}(n-1) \cdot A_{papd}^{k}(n) \cdot \cos(k \cdot \alpha_{papd}(n) + \varphi_{est}(n-1)) * TF1(n).$$

For $\varphi$ we substitute the last Phase-LMS $\varphi_{est}(n-1)$ and for g we substitute the last estimated $g_{est}(n-1)$ for the determination of the gradient. In other words, the pulling compensation circuit 110 is configured to use the preceding correction signal as a substitute for the correction signal when generating present correction signal.

The estimation of the phase component $\varphi_{est}(n)$ for the present iteration is determined according to:

$$\varphi_{est}(n) = \varphi_{est}(n-1) - \mu_{\varphi} \cdot \varphi_{gradient}(n).$$

In summary, the examples described above determine a correction signal (an "inverse pulling" term) and inject it with the appropriately determined Phase component and Gain component into the PLL subsystem such that the pulling will be suppressed. The previous paragraphs give one example as to how these Phase and Gain components may be determined such that an error due to pulling within the PLL is decreased or minimized. The injected correction signal 120 further depends on the presently submitted baseband signal, allowing to mitigate the pulling effects during normal operation of a transmitter.

As already mentioned before, FIG. 2 illustrates an example of a transmitter for baseband signal 226 using an example of a synthesizer circuit comprising an optional predistortion circuit 210. The predistortion circuit 210 is configured to estimate a nonlinearity of the amplifier 242. In particular, the predistortion circuit 210 is configured to estimate a nonlinearity of the amplifier 242 for the harmonic of the radio frequency signal 232 of the order n, n being equal to the division factor of the frequency divider 220. In other words, a dedicated predistortion circuit 210 (e.g. a digital predistortion circuit, DPD) is added to the cancellation path. With n being 2, the dedicated predistortion circuit 210 is introduced in order to estimate the $2^{nd}$ harmonic non-linearity of the PA 242, which might be different from the fundamental non-linearity compensated by means of the further predistortion circuit 260 within the transmit signal chain (the transmitter's lineup). The predistortion circuit 210 tries to anticipate the nonlinearity of the PA 242 for a different frequency and for potentially different input powers than the further predistortion circuit 260. Therefore, using a dedicated predistortion circuit 210 for the components within the output signal of the PA 242, which are the cause of pulling may greatly increase the accuracy of the anticipation. Since the correction signal 120 is derived in good anticipation of the contribution of the baseband signal 226 to the PA's output signal, increasing the accuracy of said anticipation by means of the dedicated predistortion circuit 210 will, in turn, increase suppression of the pulling effects.

Figure 7:
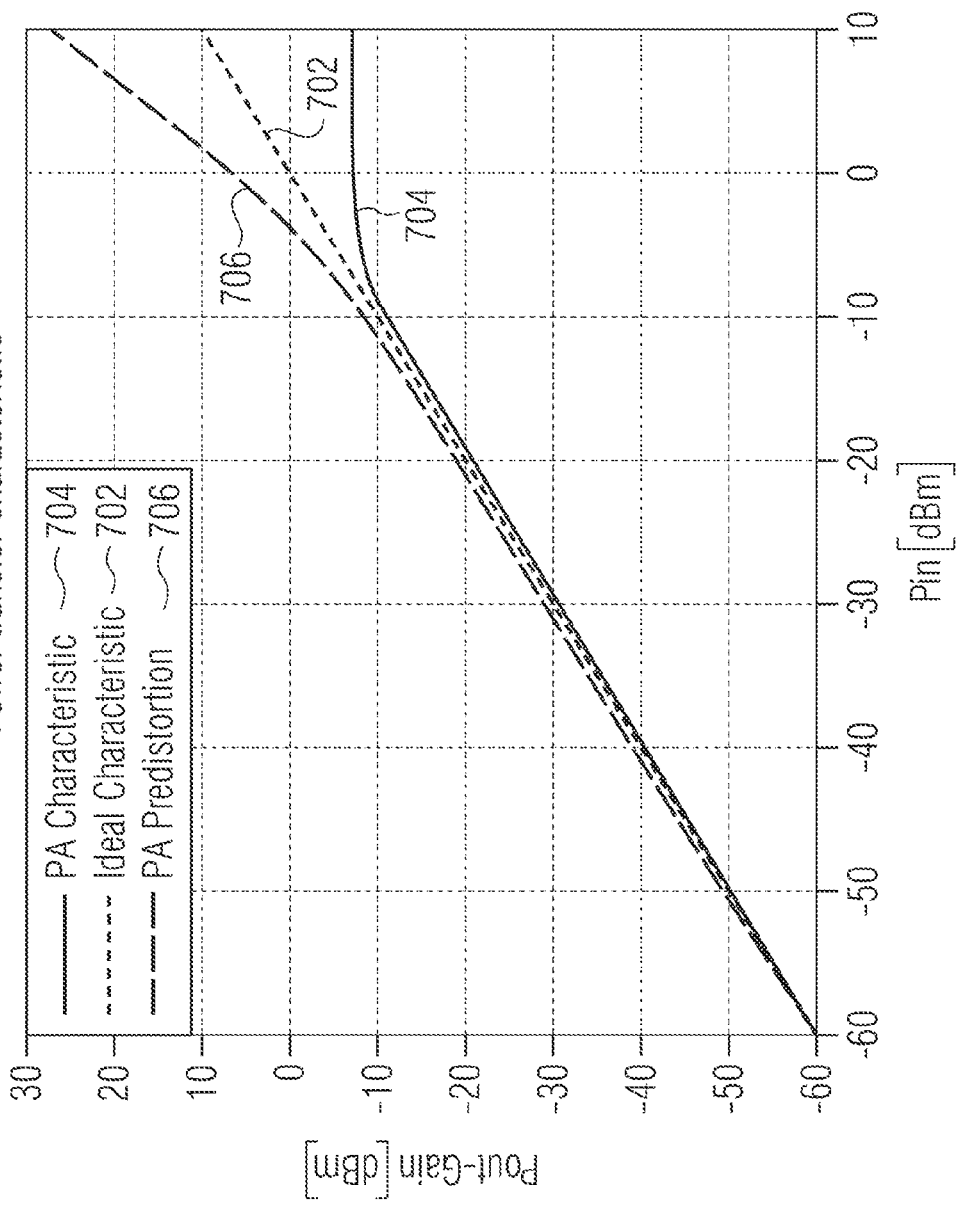
FIG. 7 illustrates a characteristic of a predistortion signal for a power amplifier.

The dedicated predistortion circuit 210 may particularly increase pulling cancellation performance when transmit power levels are high and thus enhance the active pulling cancellation 110 (APC) effectiveness, which in turn improves the Error Vector Magnitude (EVM) and may reduce the current consumption. The basic idea of digital pre-distortion is illustrated in FIG. 7 which shows the input-output transfer curve of an amplifier as well as the digital predistortion (DPD) characteristic (dashed line).

Digital pre-distortion tries to achieve that the composite output power follows an ideal linear characteristic. Summarizing the idea of the dedicated predistortion circuit 210 in front of the active pulling cancellation 110 is to account for $2^{nd}$ harmonic non linearity effects of the PA 242. In this way, the output of predistortion circuit 210 better matches to the PA output signal which leads to a better estimation accuracy of the pulling experienced by the controlled oscillator 102.

Figure 8:
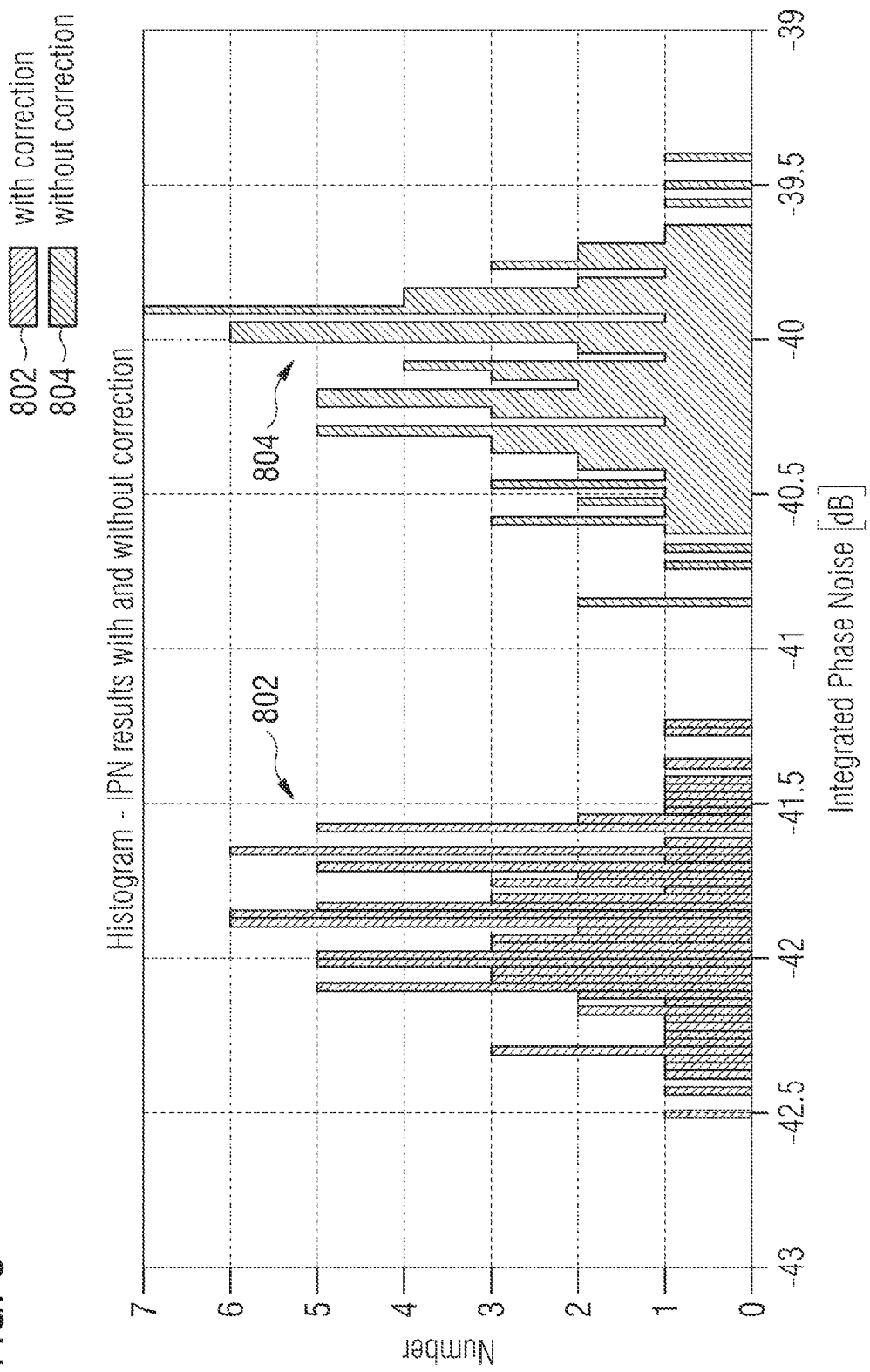
FIG. 8 illustrates a decrease of phase noise histogram using an example of a predistortion circuit within an example of a synthesizer.

The effectiveness of this dedicated predistortion circuit 210 is illustrated in FIG. 8, illustrating the integrated phase noise for implementations with and without a dedicated predistortion circuit 210. With the dedicated predistortion circuit 210, the integrated phase noise (IPN) is on average by 2 dB better. This improvement can, for example, be traded for higher transmit power level. In other words, the predistortion circuit 210 is configured to generate the information on a present sample of a baseband signal 228 using the present sample of the baseband signal 226.

The examples described herein may be summarized as incorporating Cartesian pulling cancellation. The examples implement close-loop adaptive pulling cancellation (based on an LMS algorithm, for example) "on the fly" during packets are transmitted, e.g. during normal operation transmitting payload data. According to some examples, an iterative solution of a two dimensional minimization problem is implemented, in which both the gain and the phase components of the correction signal are determined. Some examples optionally include a dedicated predistortion circuit (DPD) as part of the pulling cancellation mechanism to improve cancellation performance, e.g. at high transmit power levels. Some examples operate beyond 15 dBm as opposed to other protocols (e.g. Bluetooth) which don't require such high output power (typically less than 13 dBm).

Figure 3:
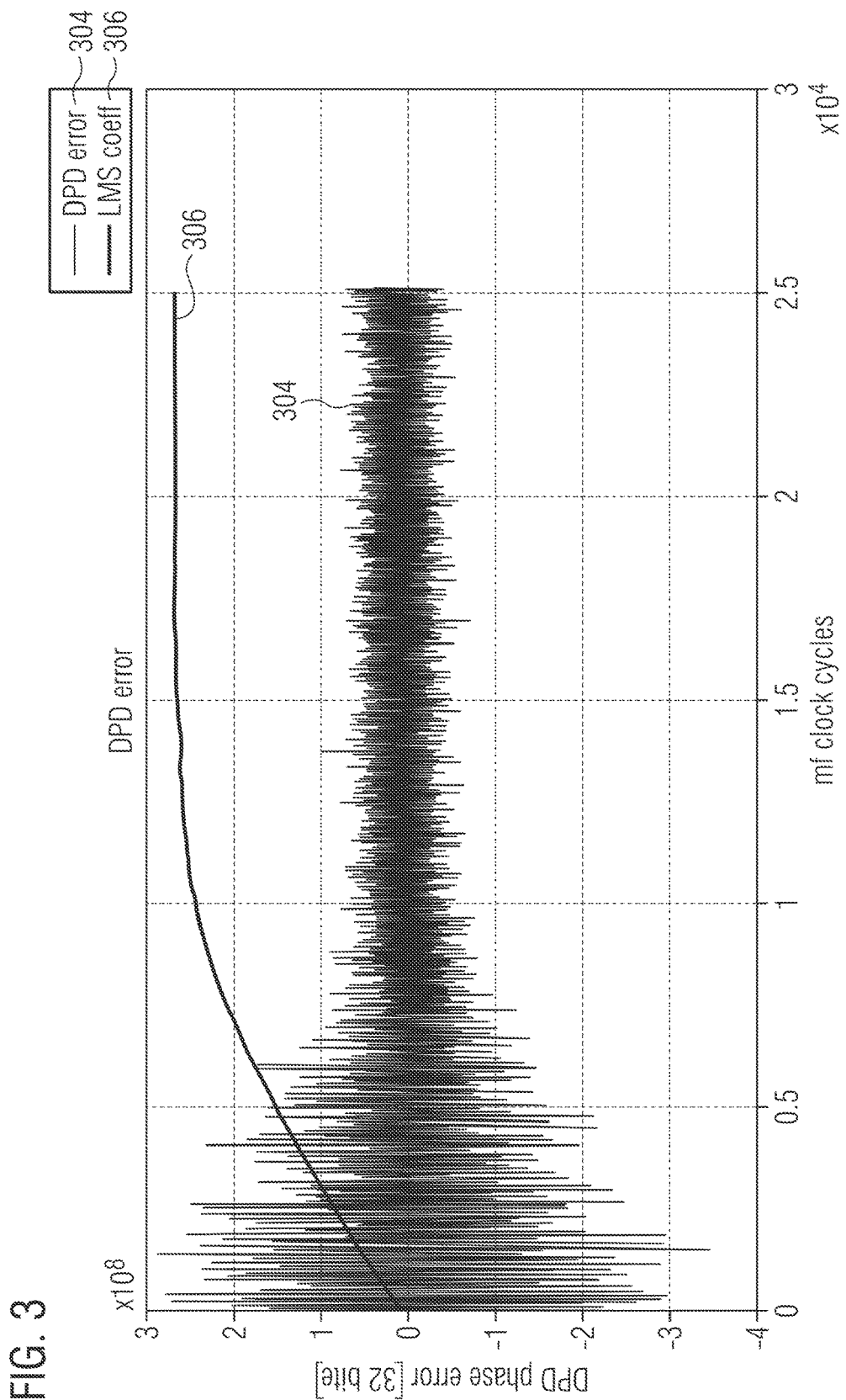
FIG. 3 illustrates a decrease of an error of an oscillating signal generated using an example of a synthesizer.

FIG. 3 illustrates a decrease of an error 304 of an oscillator signal 108 generated using an example of a synthesizer. The error corresponds to the phase error e(n) determined in the Phase Lock Loop. The x-axis of FIG. 3 gives the number of iterations or clock cycles of a digitally implemented Phase Lock Loop (DPLL), thus illustrating a temporal evolution of the error. Further, the solid line 306 illustrates the gain component of the correction signal ($g_{est}$). FIG. 3 illustrates the decrease of the error when using an example as described herein. While the magnitude of the error 304 goes to minimum, the gain component of the correction signal ($g_{est}$) is stabilized to the optimal value.

Figure 4:
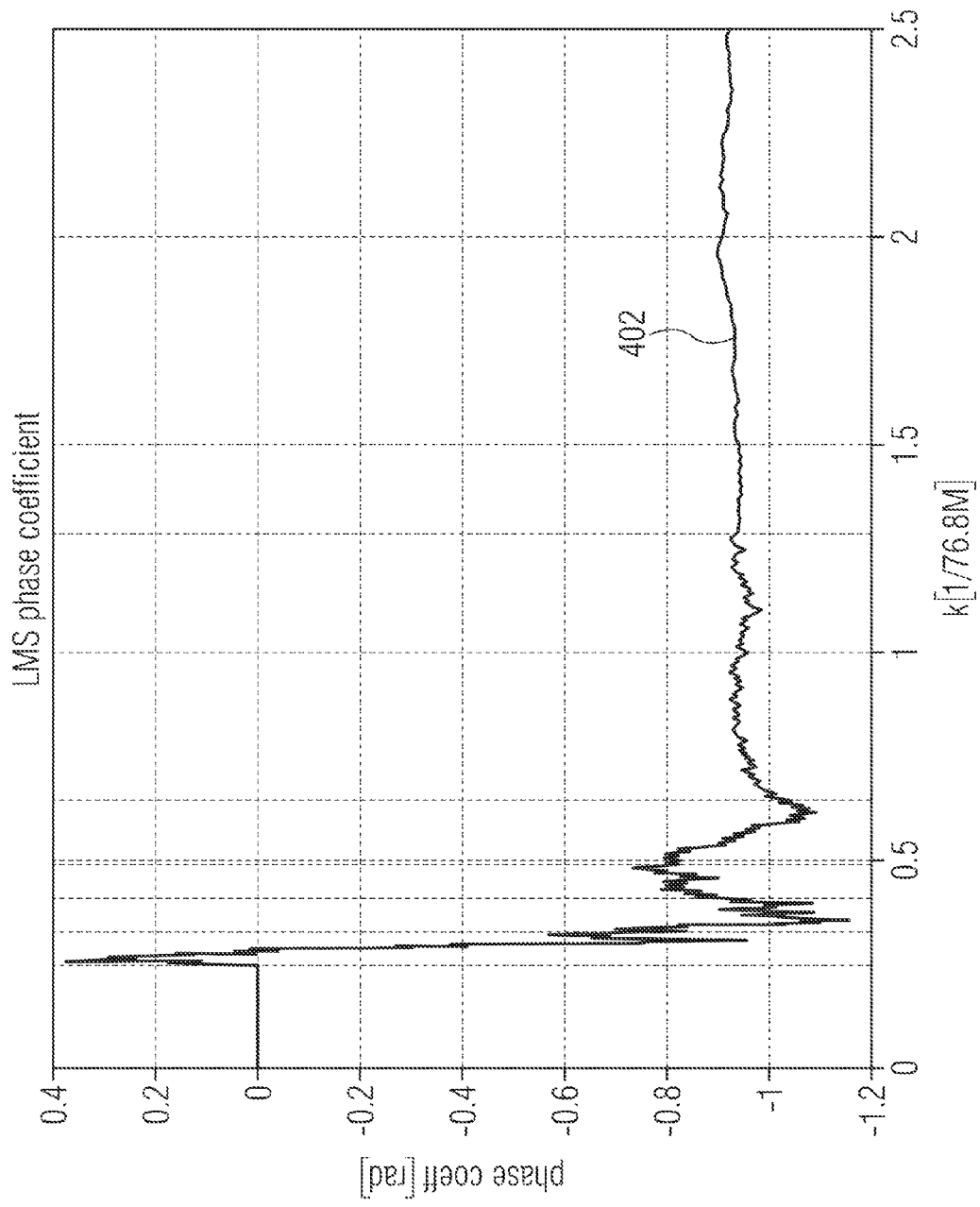
FIG. 4 illustrates the convergence of a phase component of a correction signal of an example of a synthesizer.

FIG. 4 illustrates the convergence of the phase component 402 of the correction signal versus the number of clock cycles. The determination of the phase component only starts after the PLL is locked. A PLL or a DPLL can lock under pulling impairment, albeit with higher phase noise, which is afterwards decreased using an example of a synthesizer circuit.

Figure 5:
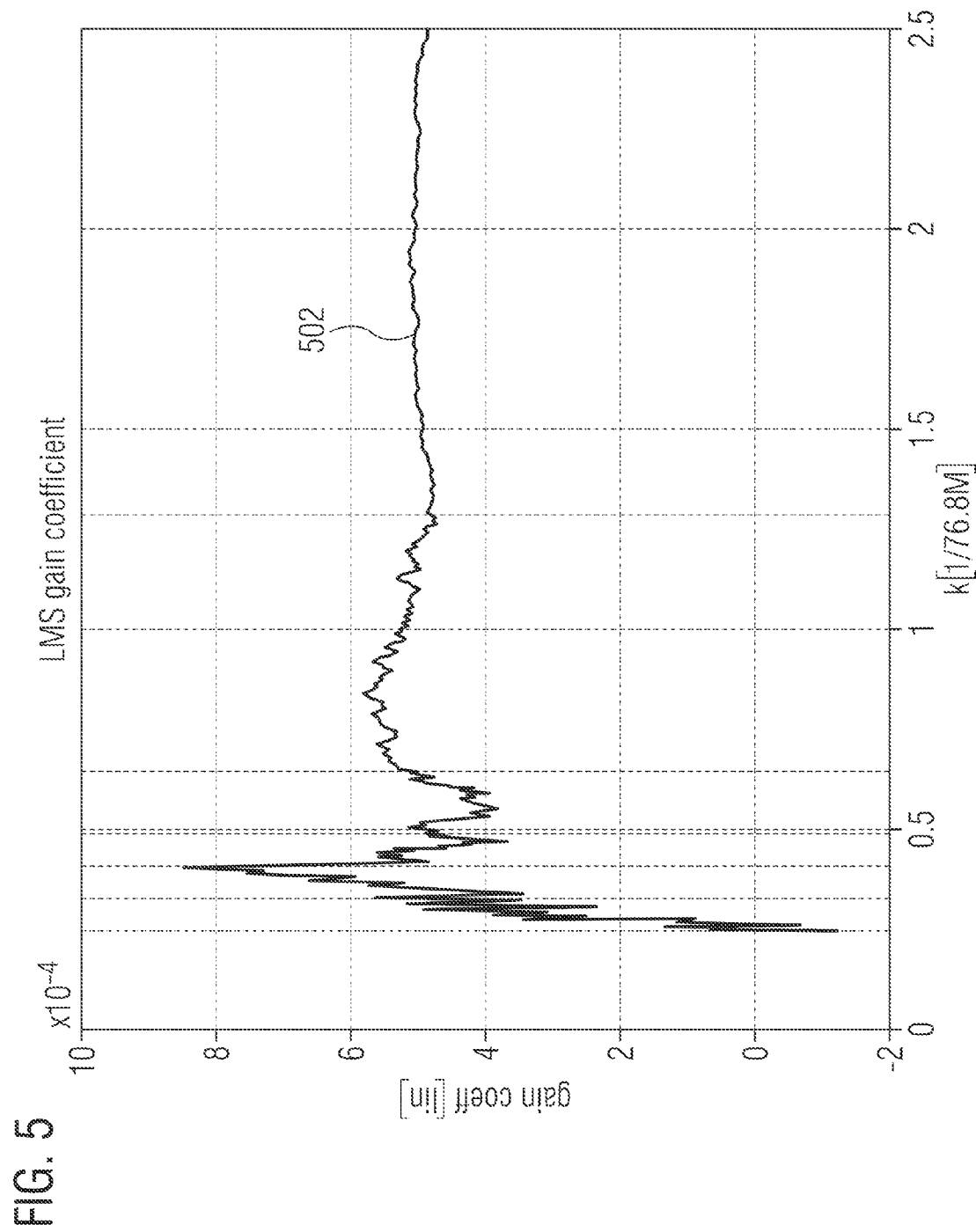
FIG. 5 illustrates the convergence of a gain component of a correction signal of an example of a synthesizer.

FIG. 5 illustrates the convergence of a gain component 502 of a correction signal.

Figure 6:
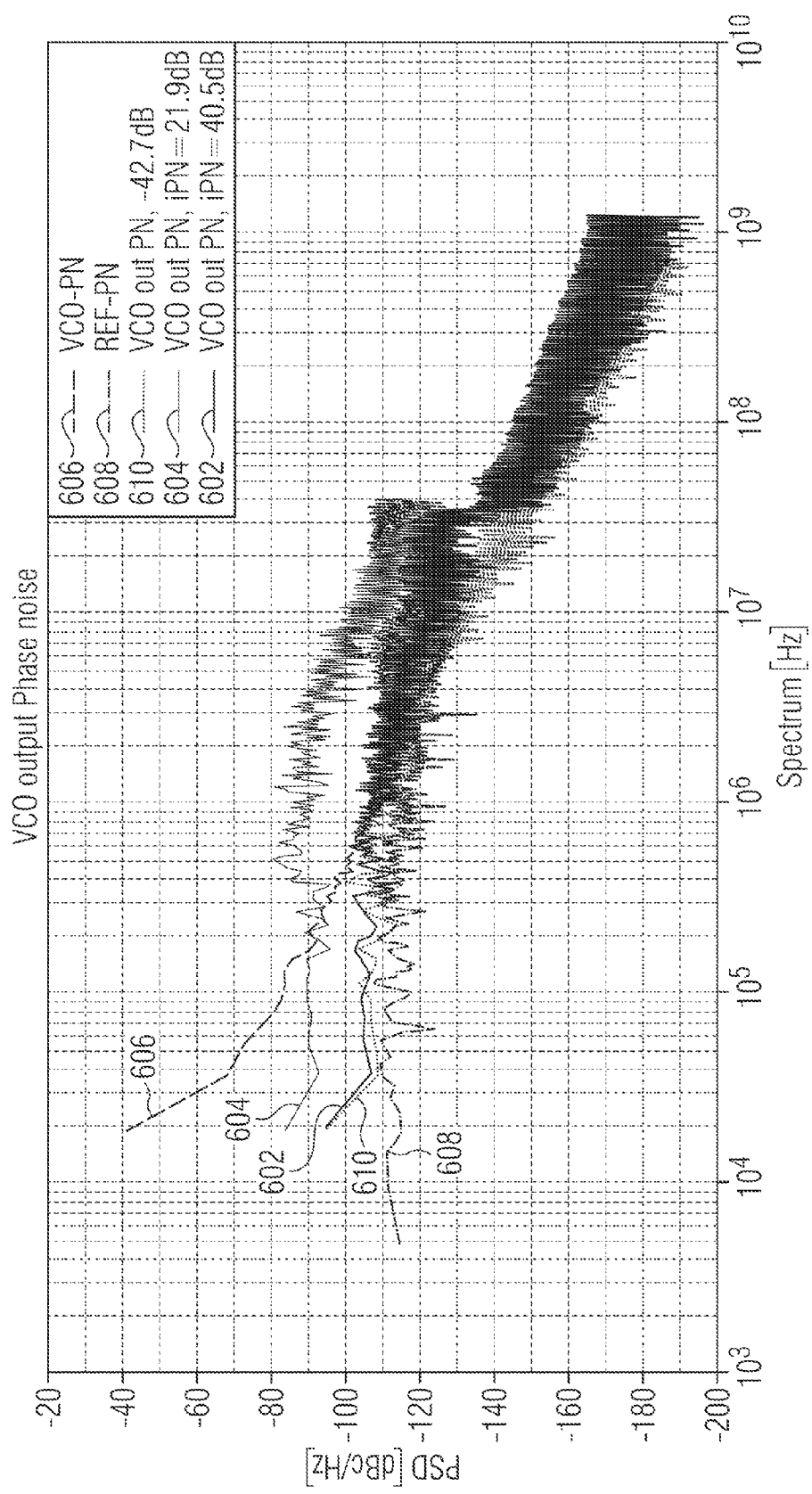
FIG. 6 illustrates a comparison of an integrated phase noise of an example of a synthesizer circuit with a conventional synthesizer.

FIG. 6 illustrates a comparison between the integrated phase noise 602 of an example of a synthesizer circuit with the integrated phase noise 604 of a conventional system. In FIG. 5, we can see the phase noise of a DPLL using an example of a synthesizer circuit (first curve, brown or first pattern) compared to the phase noise of a conventional DPLL (second curve, azure or second pattern). FIG. 6 illustrates that the integrated phase noise was decreased from −21.9 dB of the conventional DPLL down to −40.5 dB when using an example of a synthesizer circuit. The further graph 606 (blue or third pattern) illustrates the noise of the oscillator, graph 608 (green or fourth pattern) illustrates the reference clock noise and graph 610 (red or fifth pattern) illustrates the phase noise of the system under test without any pulling impairment.

FIG. 7 illustrates a characteristic of a predistortion signal for a power amplifier in dependence of the output power. The y-axis illustrates the output power for a given input power to an amplifier. The first graph 702 illustrates the desired linear iso-gain curve. The second graph 704 illustrates an amplifier's real behavior, running into compression at high output power levels. The third graph 706 illustrates the characteristic of a predistortion signal applied to the baseband signal before the amplifier in order to compensate the effects of the amplifier's compression, so that the combination of the predistortion signal and the amplifier compression result with the ideal linear gain curve.

FIG. 8 illustrates a histogram illustrating the decrease of the integrated phase noise using an example of a synthesizer circuit with a predistortion circuit as compared to the same synthesizer circuit without a predistortion circuit. The x-axis gives the phase noise in decibels (dB) while the y-axis gives the number of data packets having been transmitted with a phase noise within a data bin of the x-axis. The first set of samples 802 illustrates the data packets sent using a synthesizer circuit with a predistortion circuit, while the second set of samples 804 illustrates the phase noise of the data packets sent using the same synthesizer circuit without a predistortion circuit. Using the optional predistortion circuit within an example of a synthesizer circuit may decrease the integrated phase noise further by approximately 2 dB.

Figure 9:
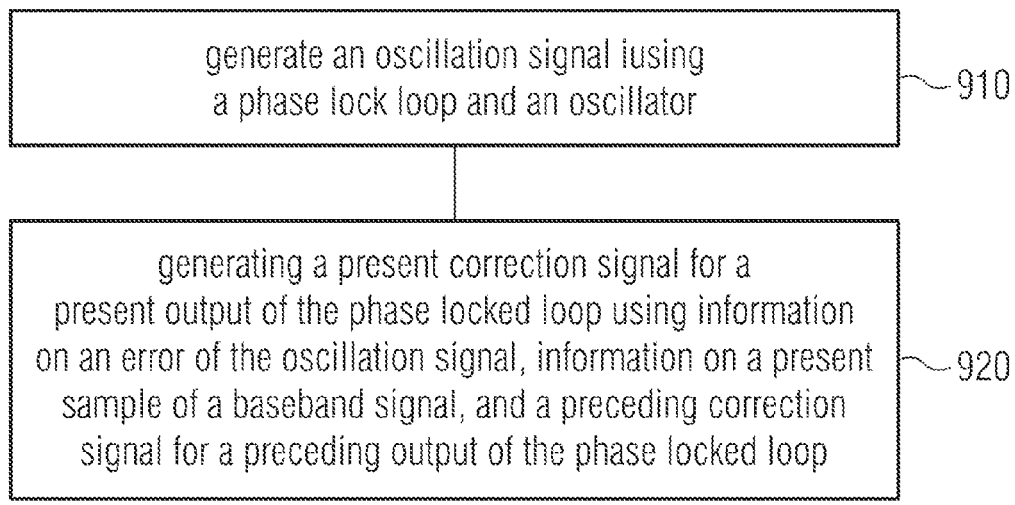
FIG. 9 illustrates a flowchart of a method for generating a local oscillator carrier signal with reduced leakage due to a baseband signal.

FIG. 9 illustrates a flowchart of a method for mitigating a leakage effect inside a Synthesizer generating a local oscillator carrier, the leakage effect being related to a baseband signal. The leakage may be caused by the baseband signal transmitted using the generated local oscillator carrier or by a baseband signal of another transmit signal chain, e.g. on the same or on a neighboring dye. The method comprises generating an oscillating signal 910 using a phase lock loop and an oscillator. Further, the method comprises generating a correction signal 920 for a present output of the phase locked loop using information on an error of the oscillating signal, information on a present sample of a baseband signal and a preceding correction signal for a preceding output of the phase locked loop.

Figure 10:
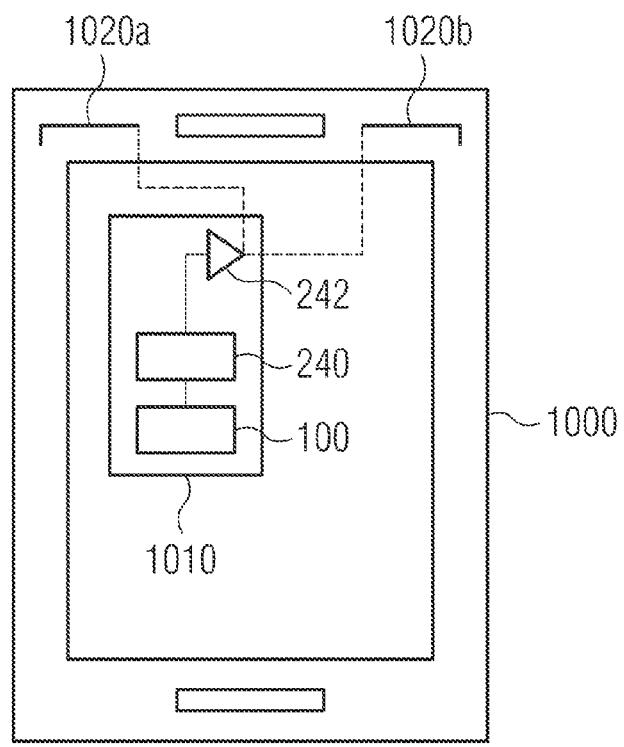
FIG. 10 illustrates an example of a mobile telecommunication device.

FIG. 10 schematically illustrates an example of a mobile telecommunications device 1000 comprising a transmitter 1010 coupled to two antennas 1020a and 1020b. The number of antennas is just an example and further examples of mobile telecommunications device may comprise more or less antennas. The transmitter 1010 comprises an example of a synthesizer circuit 100 and of a mixer circuit 240 as described herein. Further, the mobile telecommunications device 1000 comprises an amplifier 242 configured to amplify the radio frequency signal as generated by the mixer circuit 240.

Mobile telecommunication devices as disclosed in FIG. 10 using an example of a transmitter 1010 according to the examples described herein may operate according to every known and future telecommunication standard, such as for example: one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g.

Worldwide Interoperability for Microwave Access (WI-MAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

A mobile telecommunications device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A transmitter can be located in the fixed or stationary part of the network or system. A transmitter may, for example, correspond to or operate in a remote radio head, a transmission point or an access point. A transmitter can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a transmitter may correspond to a NodeB, an eNodeB, a BTS, an access point, etc., respectively.

Further examples of transmitters may also be used to transmit a signal according to other arbitrary wireless or wired transmission protocols, such as for example according to the Bluetooth, Zigbee or ZWave protocol.

Example 1 is a synthesizer circuit adapted to generate a local oscillator carrier signal for a baseband signal, comprising: a controlled oscillator comprising a phase lock loop and an oscillator configured to generate an oscillating signal; and a pulling compensation circuit configured to generate a correction signal for a present output of the phase locked loop based on information on an error of the oscillating signal, information on a baseband signal and a preceding correction signal for a preceding output of the phase locked loop.

In Example 2, in the synthesizer circuit of example 1, the pulling compensation circuit is further configured to generate the correction signal based on an iterative approximation algorithm.

In Example 3, in the synthesizer circuit of example 1, the pulling compensation circuit is configured to generate the correction signal using a Least Mean Square or a Least Square approximation.

In Example 4, in the synthesizer circuit of any of examples 1 to 3, the correction signal comprises a gain component and a phase component.

In Example 5, in the synthesizer circuit of example 4, the pulling compensation circuit determines the correction signal using a first approximation rule for the gain component; and a second approximation rule for the phase component.

In Example 6, in the synthesizer circuit of any of examples 4 to 5, the pulling compensation circuit generates the correction signal using the expression:

$g \cdot A_{papd}^{k} \cdot \sin(k \cdot \alpha_{papd}(n) + \varphi)$, wherein k is an integer factor; g represents the gain component, $\varphi$ represents the phase component and $\alpha_{papd}$, $A_{papd}^{k}$ represent the information on a present sample of the baseband signal.

In Example 7, in the synthesizer circuit of example 6, the integer factor k represents the order of a harmonic of the radio frequency generated by a power amplifier that causes a degradation of the oscillating signal.

In Example 8, in the synthesizer circuit of any of examples 4 to 7, the pulling compensation circuit is configured to use the preceding correction signal as a substitute for the correction signal when generating present correction signal.

In Example 9, the synthesizer circuit of any of the preceding examples further comprises a predistortion circuit configured to generate the information on a present sample of a baseband signal using the present sample of the baseband signal.

In Example 10, the synthesizer circuit of any of the preceding examples further comprises a frequency divider configured to generate a carrier signal to drive a mixer circuit by dividing a frequency of the oscillating signal by a division factor.

In Example 11, in the synthesizer circuit of any of the preceding examples, the pulling compensation circuit is configured to use information on a present sample of the baseband signal as the information on the baseband signal.

Example 12 is a transmitter circuit, comprising: a synthesizer circuit of any of examples 1 to 11, further comprising; and a mixer circuit configured to mix a signal based on the baseband signal and the carrier signal to generate a radio frequency signal.

In Example 13, the transmitter circuit of example 12 further comprises an amplifier configured to amplify the radio frequency signal.

In Example 14, in the transmitter circuit of example 13, the predistortion circuit is configured to estimate a nonlinearity of the amplifier.

In Example 15, in the transmitter circuit of example 14, the predistortion circuit is configured to estimate a nonlinearity of the amplifier for the harmonic of the radio frequency signal of the order n.

In Example 16, in the transmitter circuit of example 15, n is equal to the division factor.

In Example 17, in the transmitter circuit of examples 12 to 16, the division factor is 2 or 4.

In Example 18, in the transmitter circuit of any of the preceding examples, the pulling compensation circuit is configured to generate the correction signal such that a degradation of the phase noise of the oscillating signal which is caused by an amplifier using the oscillating signal is reduced or minimized.

Example 19 is a method adapted to mitigate a leakage effect of a baseband signal for a Synthesizer, the method comprising: generating an oscillating signal, by a phase lock loop and an oscillator; and generating a correction signal for a present output of the phase locked loop based on information on an error of the oscillating signal, information on a present sample of a baseband signal and a preceding correction signal for a preceding output of the phase locked loop.

In Example 20, the method of example 19 comprises generating the correction signal using an iterative approximation algorithm.

In Example 21, the method of example 20 comprises generating the correction signal using a Least Mean Square or a Least Square approximation algorithm.

In Example 22, the method of any of examples 19 to 21 comprises generating a correction signal comprising a gain component and a phase component.

In Example 23 the method of example 22 comprises using a first approximation rule for a present estimate of the gain component $g_{est}(n)$ according to:

$g_{est}(n) = g_{est}(n-1) - \mu_{gain} \cdot g_{gradient}(n)$, wherein $g_{est}(n-1)$ is a preceding estimate of the gain component; and using a second approximation rule for a present estimate of the phase component $\varphi_{est}(n)$ according to:

$\varphi_{est}(n) = \varphi_{est}(n-1) - \mu_\varphi \cdot \varphi_{gradient}(n)$, wherein $\varphi_{est}(n-1)$ is a preceding estimate of the phase component; and wherein $g_{gradient}$ is calculated according to:

$$g_{gradient}(n) = \frac{\partial e^2}{\partial g} = 2 \cdot e \cdot A_{papd}^k \cdot \sin(k \cdot \alpha_{papd}(n) + \varphi_{est}) * TF1(n)$$

and $\varphi_{gradient}$ is calculated according to:

$$\varphi_{gradient}(n) = \frac{\partial e^2(n)}{\partial \varphi} = 2 \cdot e(n) \cdot g_{est}(n-1) \cdot A_{papd}^k(n) \cdot \cos(k \cdot \alpha_{papd}(n) + \varphi_{est}(n-1)) * TF1(n),$$

wherein $\alpha_{papd}$, $A_{papd}$ represents the information on a present sample of the baseband signal, e represents a present error of the oscillating signal, k being the order of the harmonic causing the degradation and TF1 represents a Transfer function of the phase lock loop.

In Example 24, the method of example 22 or 23 comprises using the preceding correction signal as a substitute for the present correction signal when generating the present correction signal.

In Example 25, the method of any of examples 19 to 24 further comprises generating the information on a present sample of a baseband signal using the present sample of the baseband signal.

In Example 26, the method of any of examples 19 to 25 further comprises generating a carrier signal or local oscillator-signal by dividing a frequency of the oscillating signal by a division factor.

In Example 27, the method of any of examples 19 to 26 further comprises mixing a signal depending on the baseband signal and the carrier signal to generate a radio frequency signal.

In Example 28, the method of example 27 further comprises amplifying the radio frequency signal.

In Example 29, in the method of example 25, a nonlinearity of the amplifier for a radio frequency signal based on the present sample of a baseband signal is estimated to determine the information on a present sample of a baseband signal.

In Example 30, the method of example 29 comprises estimating a nonlinearity of the amplifier for the harmonic of the radio frequency signal of the order n.

In Example 31, in the method of example 30, n is equal to the division factor.

In Example 32, in the method of examples any of 26 or 31, the division factor is 2 or 4.

In Example 33, the method of any of examples 19 to 32 comprises generating the correction signal such that a degradation of the phase noise of the oscillating signal which is caused by an amplifier using the oscillating signal is reduced or minimized.

Example 34 is a mobile telecommunications device comprising a transmitter circuit according to any of examples 12 to 18.

In Example 35 is a computer program having a program code for performing, when executed by a programmable processor, a method according to any of examples 19 to 33.

Example 36 is a non-transitory computer readable storage medium comprising a computer program having a program code for performing, when executed by a programmable processor, a method according to any of examples 19 to 33.

The aspects and features mentioned and described together with one or more of the previously detailed examples and figures, may as well be combined with one or more of the other examples in order to replace a like feature of the other example or in order to additionally introduce the feature to the other example.

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A transmitter circuit comprising:
a synthesizer circuit adapted to generate a local oscillator carrier signal for a baseband signal, the synthesizer circuit comprising:
  a controlled oscillator comprising a phase locked loop and an oscillator, wherein the controlled oscillator is configured to generate the local oscillator signal based on a correction signal; and
  a pulling compensation circuit configured to generate the correction signal for a present output of the phase locked loop based on an information on an error of the local oscillator signal, an information on the baseband signal and a preceding correction signal for a preceding output of the phase locked loop; and
a mixer circuit configured to mix a signal based on the baseband signal and the local oscillator signal to generate a radio frequency signal.

2. The synthesizer circuit of claim 1, wherein the pulling compensation circuit is further configured to generate the correction signal based on an iterative approximation algorithm.

3. The synthesizer circuit of claim 1, wherein the pulling compensation circuit is configured to generate the correction signal using a Least Mean Square or a Least Square approximation.

4. The synthesizer circuit of claim 1, wherein the correction signal comprises a gain component and a phase component.

5. The synthesizer circuit of claim 4, wherein the pulling compensation circuit generates the correction signal using a first approximation rule for the gain component and a second approximation rule for the phase component.

6. The synthesizer circuit of claim 4, wherein the pulling compensation circuit generates the correction signal using the expression:
  $g \cdot A_{papd}^{k} \cdot \sin(k \cdot \alpha_{papd}(n) + \varphi)$, wherein k is an integer factor, g represents the gain component, $\varphi$ represents the phase component, and $\alpha_{papd}$ and $A_{papd}^{k}$ represent an information on a present sample of the baseband signal.

7. The synthesizer circuit of claim 6, wherein the integer factor k represents an order of a harmonic of a radio frequency generated by a power amplifier that causes a degradation of the local oscillator signal.

8. The synthesizer circuit of claim 4, wherein the pulling compensation circuit is configured to use the preceding correction signal as a substitute for the correction signal when generating the correction signal.

9. The synthesizer circuit of claim 1, further comprising a predistortion circuit configured to generate an information on a present sample of the baseband signal using the present sample of the baseband signal.

10. The synthesizer circuit of claim 1, further comprising a frequency divider configured to generate a carrier signal to drive a mixer circuit by dividing a frequency of the local oscillator signal by a division factor.

11. The synthesizer circuit of claim 1, wherein the pulling compensation circuit is configured to use an information on a present sample of the baseband signal as the information on the baseband signal.

12. A transmitter circuit, comprising:
a synthesizer circuit, the synthesizer circuit comprising:
  a controlled oscillator comprising a phase locked loop and an oscillator, wherein the controlled oscillator is configured to generate a local oscillator signal based on a correction signal; and
  a pulling compensation circuit configured to generate the correction signal for a present output of the phase locked loop based on an information on an error of the local oscillator signal, an information on the baseband signal and a preceding correction signal for a preceding output of the phase locked loop;
  a frequency divider configured to generate a carrier signal by dividing a frequency of the local oscillator signal by a division factor; and
a mixer circuit configured to mix a signal based on the baseband signal and the carrier signal to generate a radio frequency signal.

13. The transmitter circuit of claim 12, further comprising an amplifier configured to amplify the radio frequency signal.

14. The transmitter circuit of claim 13, further comprising a predistortion circuit, wherein the predistortion circuit is configured to estimate a nonlinearity of the amplifier.

15. The transmitter circuit of claim 14, wherein the predistortion circuit is configured to estimate a nonlinearity of the amplifier for a harmonic of the radio frequency signal of an order n.

16. The transmitter circuit of claim 15, wherein n is equal to the division factor.

17. The transmitter circuit of claim 16, wherein the division factor is 2 or 4.

18. The transmitter circuit of claim 12, wherein the pulling compensation circuit is configured to generate the correction signal such that a degradation of a phase noise of the local oscillator signal which is caused by an amplifier using the local oscillator signal is reduced or minimized.

19. A method for generating a radio frequency signal based on a local oscillator signal for a baseband signal, the method comprising:
generating the local oscillator signal by a phase locked loop and an oscillator based on a correction signal; and
generating the correction signal for a present output of the phase locked loop based on an information on an error of the local oscillator signal, an information on a present sample of the baseband signal and a preceding correction signal for a preceding output of the phase locked loop; and
mixing a signal based on the baseband signal and the local oscillator signal to generate the radio frequency signal.

20. The method of claim 19, comprising generating the correction signal using an iterative approximation algorithm.

21. The method of claim 19, comprising generating the correction signal using a Least Mean Square or a Least Square approximation algorithm.

22. The method of claim 19, wherein the correction signal comprises a gain component and a phase component.

23. The method of claim 22, comprising:
using a first approximation rule for a present estimate of the gain component $g_{est}(n)$ according to: $g_{est}(n)=g_{est}(n-1)-\mu_{gain} \cdot g_{gradient}(n)$, wherein $g_{est}(n-1)$ is a preceding estimate of the gain component; and
using a second approximation rule for a present estimate of the phase component $\varphi_{est}(n)$ according to: $\varphi_{est}(n)=\varphi_{est}(n-1)-\mu_\varphi \cdot \varphi_{gradient}(n)$, wherein $\varphi_{est}(n-1)$ is a preceding estimate of the phase component;

wherein $g_{gradient}$ is calculated according to:

$$g_{gradient}(n) = \frac{\partial e^2}{\partial g} = 2 \cdot e \cdot A_{papd}^k \cdot (k \cdot \alpha_{papd}(n) + \varphi_{est}) * TF1(n)$$

and
wherein $\varphi_{gradient}$ is calculated according to:

$$\varphi_{gradient}(n) = \frac{\partial e^2(n)}{\partial \varphi} = 2 \cdot e(n) \cdot g_{est}(n-1) \cdot A_{papd}^k(n) \cdot \cos(k \cdot \alpha_{papd}(n) + \varphi_{est}(n-1)) * TF1(n),$$

wherein $\alpha_{papd}$ and $A_{papd}^k$ represent the information on a present sample of the baseband signal, e represents a present error of the local oscillator signal, k being the order of a harmonic causing the degradation and TF1 represents a Transfer function of the phase lock loop.

24. A mobile telecommunications device comprising a transmitter circuit, the transmitter circuit comprising:
a synthesizer circuit comprising:
a controlled oscillator comprising a phase locked loop and an oscillator, wherein the controlled oscillator is configured to generate a local oscillator signal based on a correction signal; and
a pulling compensation circuit configured to generate the correction signal for a present output of the phase locked loop based on an information on an error of the local oscillator signal, an information on a baseband signal and a preceding correction signal for a preceding output of the phase locked loop; and
a mixer circuit configured to mix a signal based on the baseband signal and the local oscillator signal to generate a radio frequency signal.

\* \* \* \* \*